United States Patent [19]

Dingwall

[11] Patent Number: 5,726,678
[45] Date of Patent: Mar. 10, 1998

[54] SIGNAL DISTURBANCE REDUCTION ARRANGEMENT FOR A LIQUID CRYSTAL DISPLAY

[75] Inventor: Andrew Gordon Francis Dingwall, Princeton, N.J.

[73] Assignee: Thomson Consumer Electronics, S.A., Courbevoie, France

[21] Appl. No.: 399,010

[22] Filed: Mar. 6, 1995

[51] Int. Cl.$^6$ .................................................... G09G 3/36
[52] U.S. Cl. .......................... 345/100; 345/212; 345/94
[58] Field of Search ...................... 348/792, 793; 345/58, 91, 96, 104, 204, 212, 94, 98, 74, 100, 208; 330/259; G09G 3/36

[56] References Cited

U.S. PATENT DOCUMENTS

| | | | |
|---|---|---|---|
| 3,995,942 | 12/1976 | Kawakami et al. | 350/160 LC |
| 4,485,380 | 11/1984 | Soneda et al. | 340/784 |
| 4,945,352 | 7/1990 | Ejiri | 340/805 |
| 5,113,134 | 5/1992 | Plus et al. | 324/158 |
| 5,170,155 | 12/1992 | Plus et al. | 340/784 |
| 5,222,082 | 6/1993 | Plus | 377/79 |
| 5,434,599 | 7/1995 | Hirai et al. | 345/100 |
| 5,489,910 | 2/1996 | Kuwata et al. | 345/212 |

FOREIGN PATENT DOCUMENTS

| | | | |
|---|---|---|---|
| 0542307 | 5/1993 | European Pat. Off. | G09G 3/36 |
| 0564263 | 10/1993 | European Pat. Off. | G09G 3/36 |
| 0570001 | 11/1993 | European Pat. Off. | G09G 3/36 |
| 2542896 | 9/1984 | France | G09G 3/30 |

OTHER PUBLICATIONS

PCT Patent Application No. 9405987, May 17, 1994 (translation of pp. 14 and 15).

*Primary Examiner*—Glenton B. Burgess
*Attorney, Agent, or Firm*—Joseph S. Tripoli; Joseph J. Laks; Sammy S. Henig

[57] ABSTRACT

In an array of a liquid crystal display device having data lines and row select lines, a pair of conductors are provided in a direction transverse to that of the row select lines at opposite sides of the display device. The conductors are capacitively coupled to the row select lines. An amplifier is responsive to a signal generated in one of the conductors from capacitively coupled disturbance signals developed in the row select lines. The amplifier develops an output signal at the other conductor that is also capacitively coupled to the row select lines in a manner that tends to reduce the disturbance signals.

14 Claims, 6 Drawing Sheets

FIG. 3a INPUT
FIG. 3b C3
FIG. 3c C2
FIG. 3d C1

SIGNAL DISTURBANCE REDUCTION ARRANGEMENT FOR A LIQUID CRYSTAL DISPLAY

BACKGROUND OF THE INVENTION

This invention relates generally to drive circuits for display devices and particularly to a system for applying brightness signals to pixels of a display device arranged in a matrix such as, for example, a liquid crystal display (LCD).

Display devices, such as liquid crystal displays, are composed of a matrix of pixels arranged horizontally in rows and vertically in columns. The video information to be displayed is applied as brightness (gray scale) signals to data lines which are individually associated with each column of pixels. The rows of pixels are sequentially scanned by signals that are developed in row select lines. The capacitance of the pixel associated with the activated row select line is charged to the various brightness levels in accordance with the level of the brightness sign applied to the individual columns via the corresponding data lines.

Amorphous silicon has been the preferable technology for fabricating liquid crystal displays because this material can be fabricated at low temperatures. Low fabrication temperature is important because it permits the use of standard, readily available and inexpensive substrate materials. However, the use of amorphous silicon thin film transistors (a-Si TFTs) in integrated peripheral pixel drivers causes design difficulties because of low mobility, threshold voltage drift and the availability of only N-type type metal oxide semiconductor (N-MOS) enhancement transistors.

In an active matrix display each pixel element includes a switching device which applies the video signal to the pixel. Typically, the switching device is a which receives the brightness information from solid state circuitry. Because both the TFT's and the circuit are composed of solid state devices it is preferable to simultaneously fabricate the TFT's and the drive circuitry utilizing either amorphous silicon or polysilicon technology. U.S. Pat. No. 5,170,155 in the names of Plus et al., entitled "System for Applying Brightness Signals To A Display Device And Comparator Therefore", describes an example of data line or column drivers of an LCD.

Because of parasitic coupling between the column data lines and row select lines, the data ramping voltage developed in the data lines is capacitively coupled to each of the row select lines and produces therein a parasitic disturbance signal. It is desirable to prevent such parasitic signal from developing in the row select lines to prevent the false selection of a row.

Select line drive circuitry is desirably fabricated directly onto the same substrate and concurrently with the fabrication of the liquid crystal cells. An example of a known scan or shift register that drives the row select lines is described in U.S. Pat. No. 5,222,082, which may be integrated with a liquid crystal display device. An output section of the register is arranged as a push-pull amplifier that may be formed by TFT's. When a given row is de-selected, a pulldown TFT of the push-pull amplifier is turned on for applying a suitable impedance at a terminal of a row line conductor of the de-selected row. Thereby, the aforementioned parasitic signal is shunted or prevented from developing at a significant magnitude at the row line conductor.

Each row line conductor is de-selected during the majority of an updating cycle or a frame time. Consequently, the pulldown TFT's are conductive most of the time and are susceptible to being over-stressed.

In order to reduce threshold voltage drift in the pulldown TFT, it is desirable to avoid significant driving of the pull-down TFT. Therefore, it is desirable to reduce the magnitude of current which the pull-down TFT is required to conduct. Advantageously, by reducing the noise signal, the current which the pull-down TFT is required to conduct is reduced. Therefore, the pull-down TFT becomes less critical in the circuit.

SUMMARY OF THE INVENTION

A video display apparatus embodying an aspect of the invention applies a video signal to pixels arranged in a plurality of rows and in a plurality of columns of an array of a display device. The apparatus includes a plurality of row select line drivers for successively applying row select signals to a plurality of row select lines. A plurality of data line drivers apply the video signal to a plurality of data lines associated with the plurality of columns. An amplifier is responsive to disturbance signals that are developed in corresponding lines of the array for generating an amplified output signal. The output signal is indicative of the disturbance signals and is coupled in a negative feedback manner via an additional line of the array to the disturbance signal developing lines for substantially reducing the disturbance signals.

Advantageously, similar noise cancellation arrangements may be applied to display devices other than LCD display devices that utilize matricies for addressing pixels such as, for example, a plasma discharge display.

DETAILED DESCRIPTION

Figure 1:
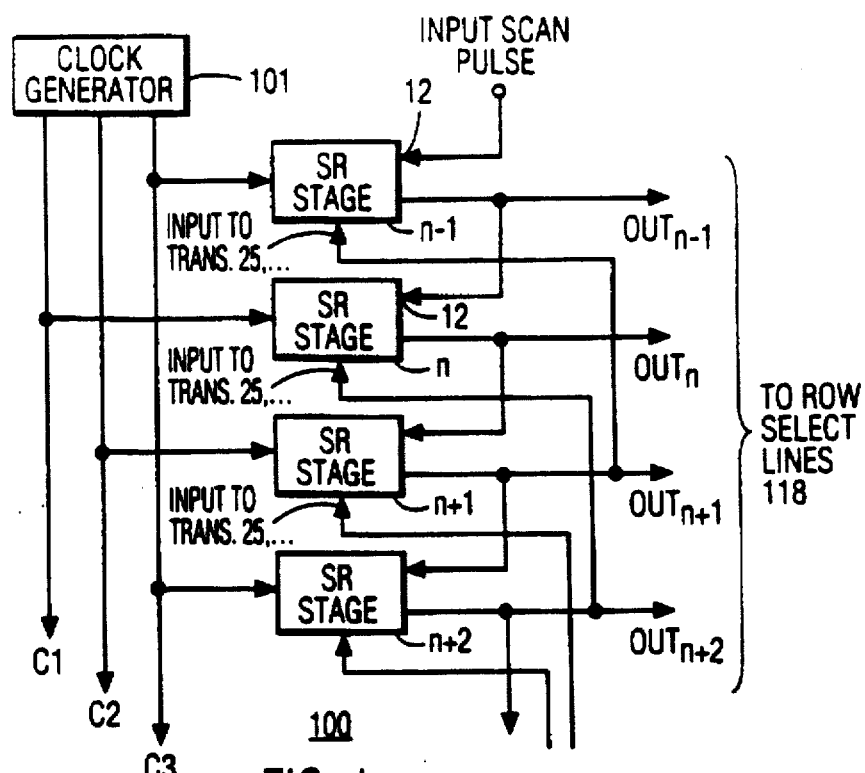
FIG. 1 illustrates a block diagram of a shift register including a plurality of cascaded stages.
Figure 2:
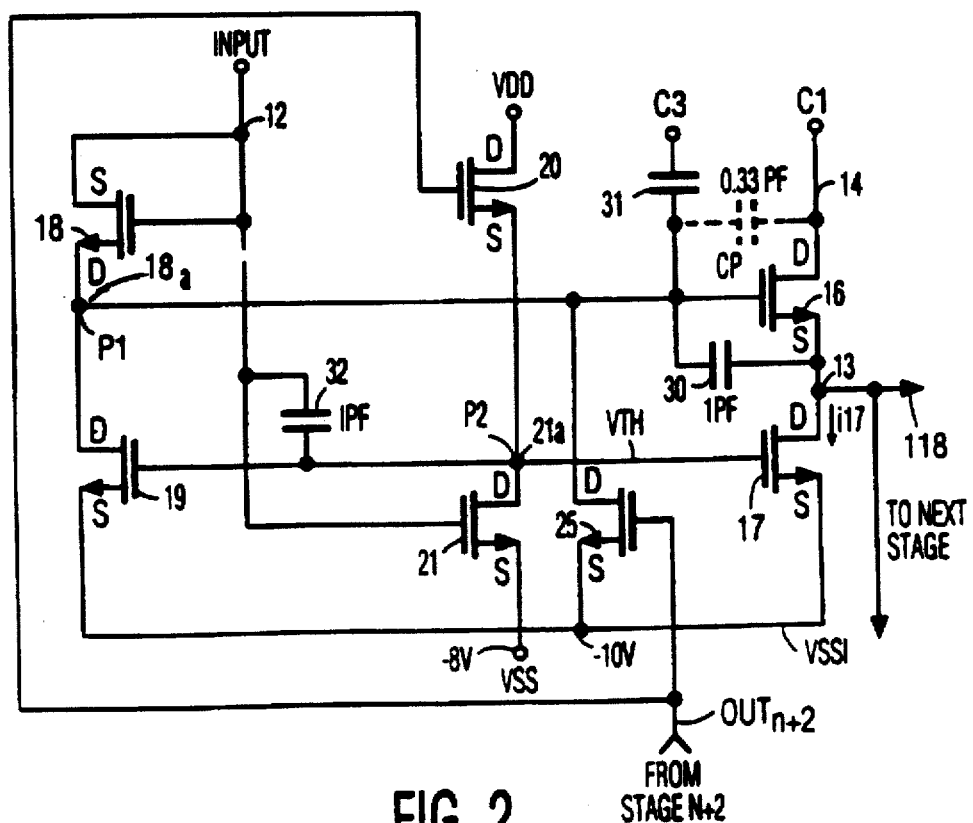
FIG. 2 illustrates a schematic diagram of a shift register stage, embodying an aspect of the invention, that can be used in the shift register of FIG. 1.

FIG. 2 illustrates an exemplary stage n, of a shift register 100 of FIG. 1. Shift register 100 of FIG. 1 drives row select lines 118 of a liquid crystal display matrix, not shown in FIG. 1. In shift register 100, stages n−1, n, n+1 and n+2 are coupled to one another in a cascade configuration. An output signal of a given stage is coupled to an input of the immediately following stage in the chain. For example, an output pulse $OUT_{n-1}$ of preceding stage n−1 in the chain of register 100 is coupled to an input terminal 12 of stage n of FIG. 2. Illustratively, only four stages, n−1, n, n+1 and n+2 are shown. However, the total number of stages n in the chain of register 100 is substantially larger. Shift register 100 may be referred to as a "walking one" shift register. This is so because a TRUE state propagates through register 100 during a video frame time.

Figure 3:
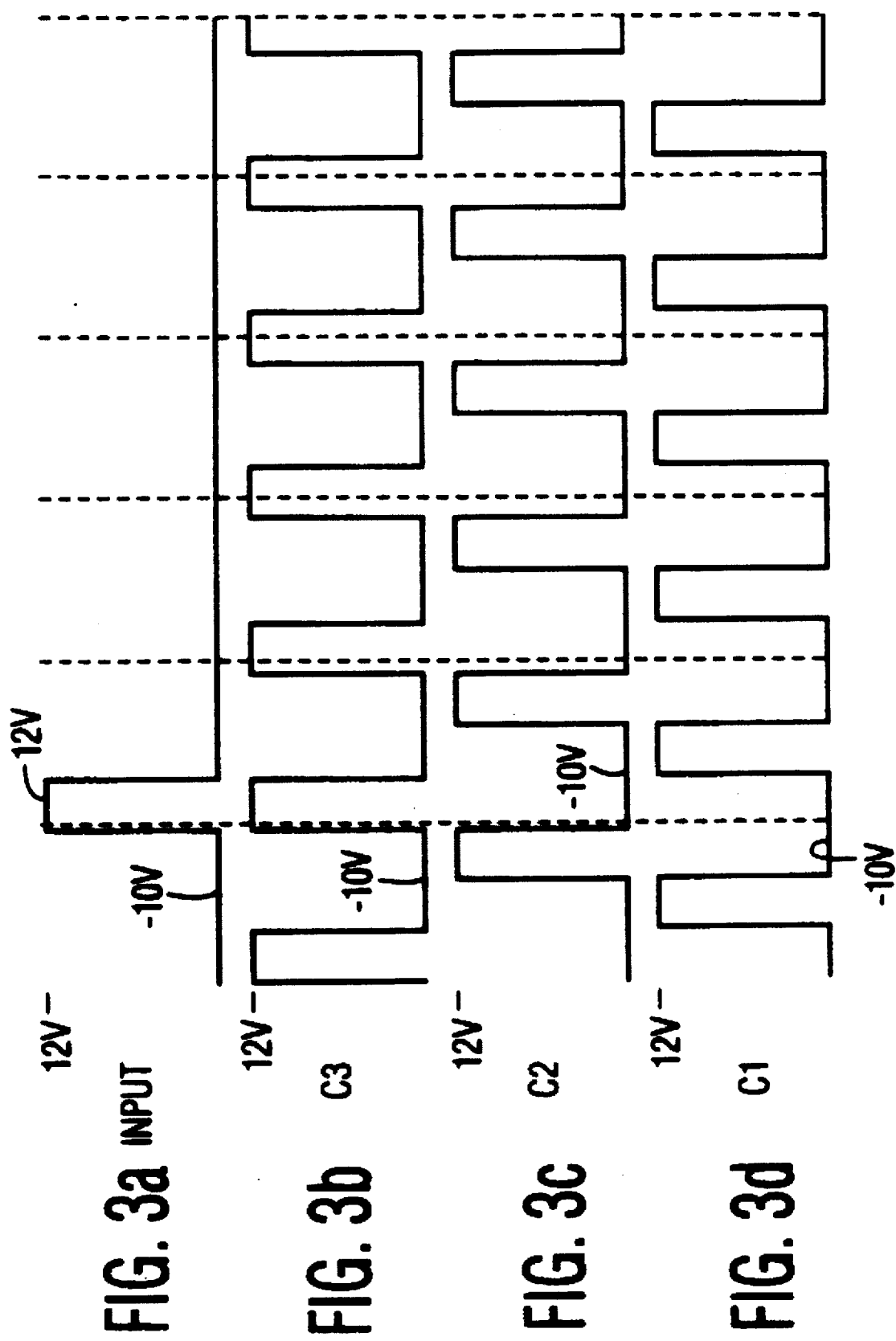
FIGS. 3a–3d are waveform diagrams illustrating the relative timing of the output signals and the respective clock signals occurring at respective nodes of the FIG. 1 shift register utilizing stages illustrated in FIG. 2.

A clock generator 101 of FIG. 1 produces a three-phase clock signal, (clock signals C1, C2 and C3) having waveforms that are shown in FIGS. 3d, 3c and 3b, respectively. The pulse of signal $OUT_{n-1}$ of FIG. 3a is produced when the pulse of clock signal C3 is applied to stage n−1 of FIG. 1. Similar symbols and numerals in FIGS. 1, 2 and 3a–3d indicate similar items or functions.

Signal $OUT_{n-1}$ of FIG. 1 is developed at input terminal 12 of stage n of FIG. 2. Signal $OUT_{n-1}$ at the HIGH level is coupled via a transistor 18 of FIG. 2 operating as a switch to a terminal 18a for developing a control signal P1. Immediately prior to the occurrence of clock signal C1, signal P1 at terminal 18a is boosted to a higher potential using a boot-strap operation by clock signal C3 that is applied to terminal 18a via a capacitor 31. Signal $OUT_{n-1}$ of stage n−1 that is coupled to input terminal 12 of stage n is also coupled to the gate electrode of a transistor 21. A drain electrode of transistor 21 is coupled via a terminal 21a to the gate electrode of a transistor 19 and to the gate electrode of a pull-down transistor 17. As a result, both transistors 19 and 17 are rendered non-conductive.

The HIGH level of signal P1 is temporarily stored in an inter-electrode capacitance, not shown, and in a capacitor 30. Signal P1 that is developed at the gate of an output transistor 16 conditions output transistor 16 for conduction. Clock signal C1 of FIG. 3d is coupled via transistor 16 to the output terminal 13 when terminal 18a is high. Interelectrode parasitic capacitances CP tend to bootstrap the potential at terminal 18a, providing extra drive to transistor 16. Consequently, an output pulse signal $OUT_n$ is developed at the output terminal 13 of register n. During this interval, pull-down transistor 17 is rendered non-conductive by the operation of transistor 21 and has no effect then on signal $OUT_n$.

Signal $OUT_n$ of stage n is applied to an input terminal of subsequent stage n+1 of FIG. 1. Stage n+1 operates similarly to stage n except for utilizing clock signal C2, instead of clock signal C1 in stage n, for turning on the corresponding transistor. When clock signal C1 attains the inactive LOW level, transistor 16 remains turned on until signal P1 goes low. Signal $OUT_n$ of stage n goes low by virtue of discharge through transistor 16 when clock signal C1 is low.

A transistor 25 has its drain-source conduction path coupled between terminal 18a and a reference potential VSS1 sufficient to turn off pull-up transistor 16 when transistor 25 is conductive. The gate of transistor 25 of stage n is coupled to an output terminal of subsequent stage n+2 in the chain of FIG. 1 and is controlled by an output signal $OUT_{n+2}$.

The pulse of signal $OUT_{n+2}$ occurs concurrently with clock signal C3 of FIG. 3b. The pulse of signal $OUT_{n+2}$ causes transistor 25 of FIG. 2 to discharge the aforementioned interelectrode capacitance CP at terminal 18a. Transistor 25 clamps the signal at terminal 18a to a level that prevents transistor 16 from generating any additional pulse of signal $OUT_n$ when the immediately following pulse of clock signal C1 occurs.

The pulse of signal $OUT_{n+2}$ is also coupled to a gate of a transistor 20 for turning on transistor 20. Transistor 20 applies a voltage VDD, embodying another inventive feature, to terminal 21a for turning on transistors 17 and 19. Following the pulse of signal $OUT_{n+2}$, transistor 20 is turned off. However, a capacitor 32 that is coupled to the gate of transistors 17 and 19 stores a charge by the operation of transistor 20. The stored charge in capacitor 32 maintains transistors 17 and 19 conductive until the next scanning cycle, when the signal at terminal 12 causes transistor 21 to turn on and, thereby, transistors 17 and 19 to turn off. Capacitor 32 also provides noise filtering for the signal at terminal 12.

As long as transistor 17 is conductive, it operates as a pull-down transistor for applying a suitable impedance at terminal 13. Thus, transistor 17 sinks a current i17. Advantageously, the drain-source impedance of transistor 17 is sufficiently low to discharge the high level on the row select line and in addition it should be sufficiently low to sink any parasitic currents coupled to the row select line from the column lines of the LCD matrix. If parasitic currents are not dissipated by transistor 17, they may produce potentials that grow to a large magnitude sufficiently large to cause a false selection in the subsequent register stage. Thus, a false selection may be prevented provided that the threshold voltage of transistor 17 does not significantly increase over the operation life. Advantageously, when transistor 19 is conductive, it prevents clock signals C1 and C3 from turning on transistor 16.

A pulse at each output terminal of register 100 of FIG. 1, for example, the pulse of signal $OUT_{n+2}$ occurs only once during a vertical interval of approximately 16.6 millisecond. Therefore, advantageously, none of the switched transistors 18, 16, 20 and 25 of stage n of FIG. 2 is biased for conduction more than one clock period, during each vertical interval. On the other hand, transistors 17 and 19 are biased for continuous conduction, during most of the vertical interval. It may be desirable to reduce potentials applied to transistors 17 and 19 which may cause the threshold voltages of transistors 17 and 19 to increase and their current sinking capabilities to decrease.

To reduce stress in transistors 17 and 19, signal P2 at the gate of transistor 17 is established at a voltage level that is greater than the threshold voltage of transistor 17 by no more than, for example, 2V at the start of the operational lifetime. Because a threshold voltage VTH of transistor 17 increases as a result of stress, it is desirable to compensate for such increase in threshold voltage VTH in a manner which keeps current conduction capability of transistors 17 and 19 substantially constant over the operation lifetime.

Advantageously, variable voltage VDD that controls the conductivity of transistors 17 and 19 is increased in a manner to track threshold voltage drift in transistors 17 and 19, during the operation lifetime. The variation in voltage VDD prevents a decrease in the conductivity of transistor 17, for example, that could result from threshold voltage drift of voltage VTH of transistor 17.

Figure 4:
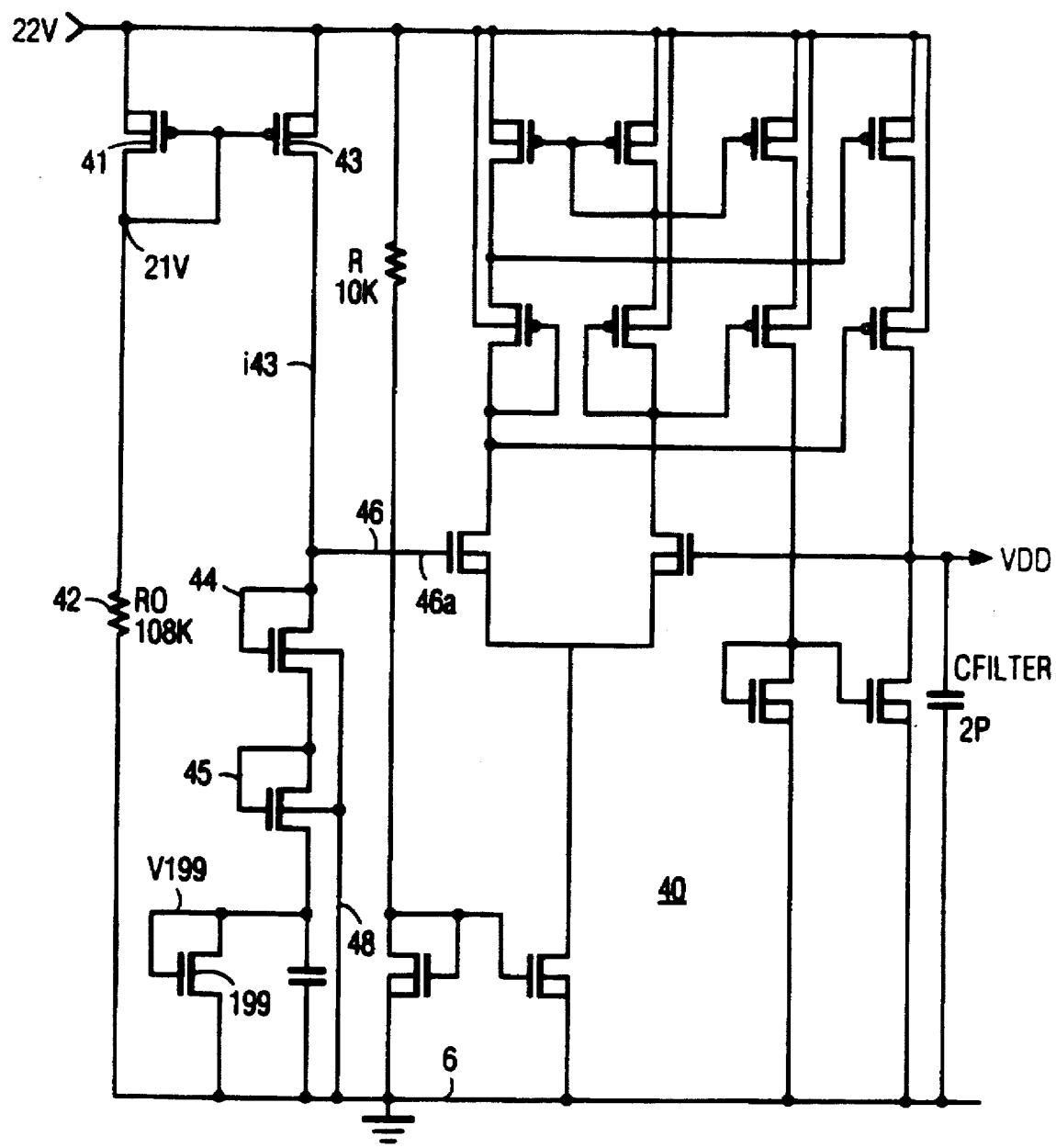
FIG. 4 is a schematic diagram of a threshold voltage variation compensation arrangement, embodying an aspect of the invention, for the circuit of FIG. 2.

FIG. 4 illustrates a threshold voltage drift compensations circuit 40, that produces voltage VDD of FIGS. 2 and 4. Except for a TFT 199, the circuit elements of circuit 40 are formed separately from shift register 100 of FIG. 1 such that all other transistors of circuit 40 may be single crystal transistors and not TFT's. TFT 199 is formed together with shift register 100 of FIG. 1 on the glass of the LCD, and is used for sensing any threshold drift in the TFT's.

In circuit 40, a P-type MOS transistor 41 is coupled in series with a resistor 42 for producing a predetermined constant control current in transistor 41. A transistor 43 is coupled to transistor 41 in a current mirror configuration. Thus, the current i43 in transistor 43 is current mirror controlled by transistor 41. Current i43 is coupled to a series coupled arrangement of a transistor 44, a transistor 45 and TFT 199 that are N-type transistors. As a result of current i43, a threshold voltage compensating voltage 46a is developed at a terminal 46, across the series arrangement.

A gate electrode of TFT 199 is coupled to its drain electrode. Therefore, a source-drain voltage V199 across TFT 199 is equal to a source-gate voltage of TFT 199. Gate-source voltage V199 across TFT 199 provides a first portion of voltage 46a. Voltage V199 is indicative of the threshold voltage of transistor 199. Because TFT 199 has a similar threshold voltage variation characteristics as transistor 17 of FIG. 2, voltage V199 is also indicative of threshold voltage VTH of transistor 17. For design convenience, TFT 199 is a larger transistor. Therefore, a relatively larger magnitude of current i43 than that flowing in transistor 17 is used for developing voltage V199. When, as a result of stress, an increase in threshold voltage VTH occurs in transistor 17 of FIG. 2, a corresponding increase in voltage V199 of FIG. 4 occurs because of the similarly of characteristics and stress.

Each of transistors 44 and 45 that are coupled in series with TFT 199 has its gate coupled to its drain and has a substrate terminal that is coupled via a conductor 48 to a reference level G. A portion of voltage 46a that is developed in transistors 44 and 45 is summed up with voltage V199 to produce voltage 46a. In this way, voltage 46a is made larger by approximately 2V than voltage V199. Voltage V199 is approximately equal to threshold voltage VTH of transistor 17 of FIG. 2 and increases when voltage VTH increases.

Voltage 46a is coupled to a non-inverting, unity gain amplifier for producing voltage VDD that is equal to voltage 46a. Voltage VDD is applied through transistor 20 of FIG. 2 for varying the voltage level of signal P2 of transistor 17.

The aforementioned voltage difference of, for example, 2V that is produced by transistors 44 and 45 of FIG. 4 is attained at the beginning of the operation service of the LCD. During the service hours, the threshold voltage of transistor 199 increases. It may be desirable to have voltage 46a increase by more than the increase of voltage V199 for maintaining the same conductivity in transistor 17 of FIG. 2.

Advantageously, the substrate is biased at a level that is smaller than a source voltage of each of transistors 44 and 45, as indicated before. An increase in voltage V199 produces a channel modulation in each of transistors 44 and 45. The channel modulation is attained by the source-substrate voltage increase. As a result, the resistivity of each of transistors 44 and 45 increases along with the increase of voltage V199. In this way, advantageously, voltage 46a is increased in a non-linear manner. The increase in voltage 46a is proportionally larger than if transistors 44 and 45 operated as linear resistors, or simple level shifters. Advantageously, in this way, the conductivity of transistor 17 may be maintained relatively constant even when threshold voltage VTH of transistor 17 increases.

Figure 5:
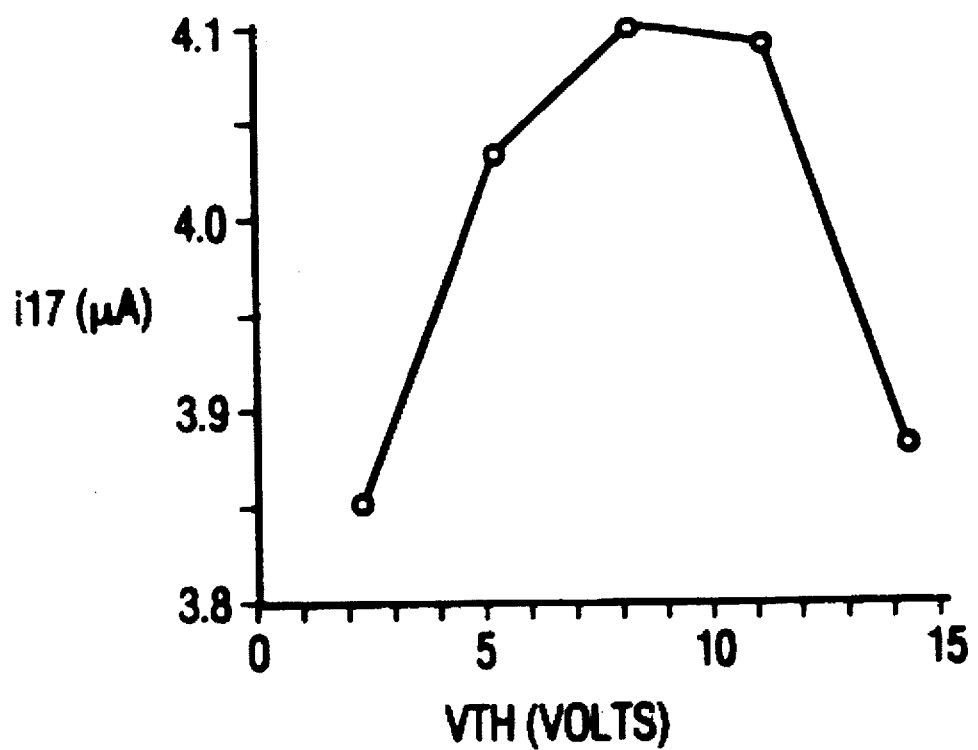
FIG. 5 illustrates a graph useful in explaining the operation of the FIG. 4 circuitry.

FIG. 5 shows an example of the magnitude of current i17 that transistor 17 can sink for a source-drain voltage maintained no greater than 50 mV. As shown in FIG. 5, current i17 changes by less than 5% for a corresponding change in threshold voltage VTH of about 10V.

In order to reduce the stress in transistor 17 it is desirable to maintain the current i17 low, such as within the current range, for example, shown in FIG. 5. Conducting current i17 at a higher magnitude than the range of FIG. 5 might require a higher gate-source voltage in transistor 17. Such higher gate-source voltage might result in a higher stress in transistor 17 and, therefore, disadvantageously, in a shorter operational life.

Figure 6:
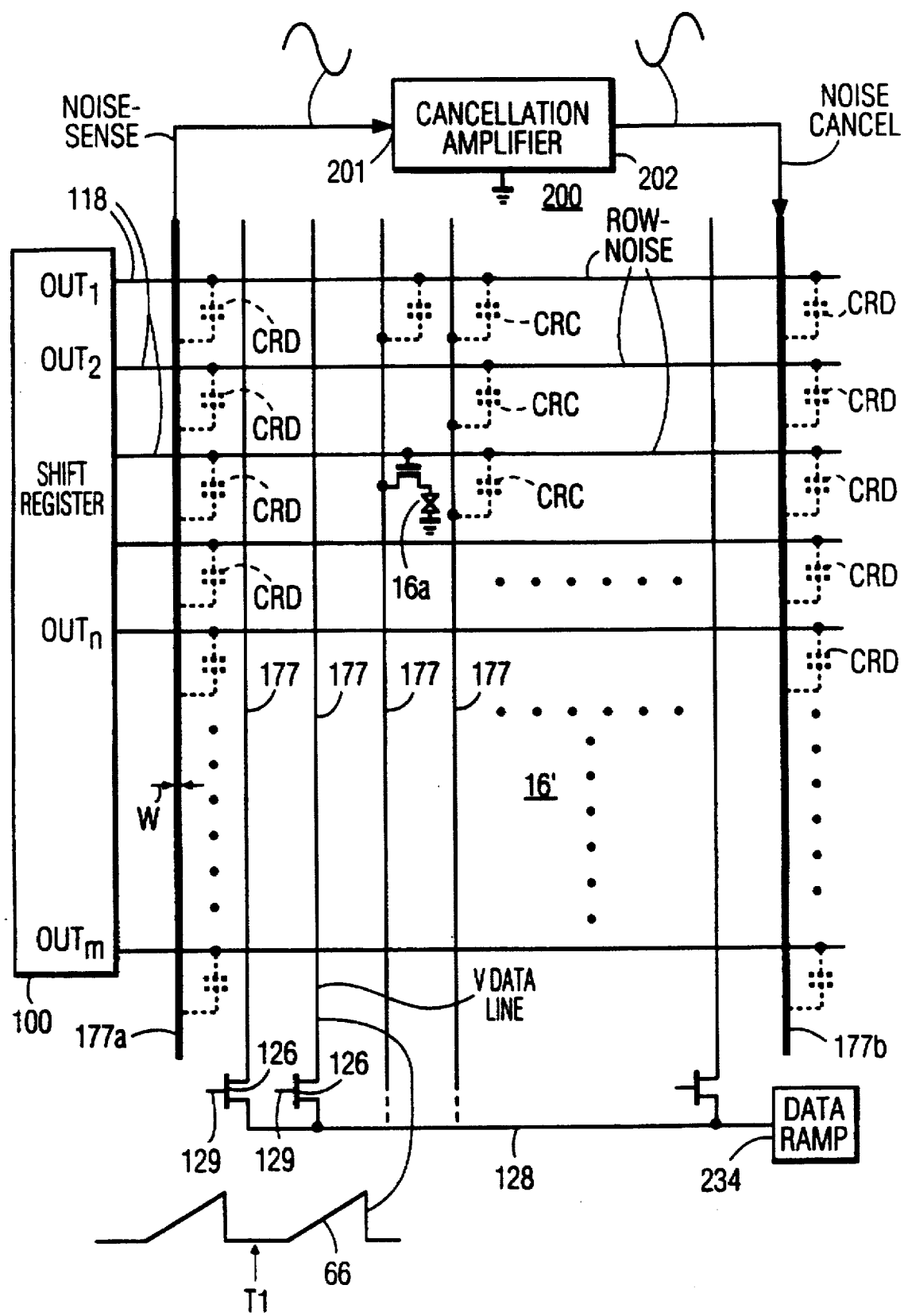
FIG. 6 illustrates a liquid crystal display with a noise cancellation arrangement for reducing a current in an output stage of the shift register of FIG. 2.

FIG. 6 illustrates a noise compensation circuit 200, embodying an aspect of the invention, that is applied to a liquid crystal array 16'. Similar symbols and numerals in FIGS. 1, 2, 3a–3d and 4–6 indicate similar items or functions. Circuit 200 of FIG. 6 maintains current i17 of FIG. 2 at a relatively small magnitude. Array 16' of FIG. 6 includes column data lines 177 and row select lines 118. Row select lines 118 are driven by shift register 100 of FIG. 1 for successively selecting row lines 118. Column data lines 117 may be driven in a similar way to that described in U.S. Pat. No. 5,170,155 in the names of Plus et al., entitled "System for Applying Brightness Signals To A Display Device And Comparator Therefore". The data line drivers of Plus et al., operate as chopped ramp amplifiers. Each data line 177 of FIG. 6 is driven by a corresponding transistor 126. A given transistor 126 of a corresponding data line driver couples a data ramp voltage 128, produced in a data ramp generator 234 to a corresponding data line 177 of the matrix for developing a ramp signal in pixels 16a of the selected row. Transistor switch 126 is controlled by a comparator, not shown. Transistor switch 126 is turned on for coupling the data ramp voltage 128 to the data line 177 and is turned off at a controllable instant that is determined by the magnitude of the picture information containing video signal, not shown.

In carrying out an inventive feature, in addition to the conventional data lines 177, array 16' includes a pair of column lines 177a and 177b that do not provide picture information and are referred to herein as dummy column lines 177a and 177b. Column lines 177a and 177b are placed in parallel to data lines 177 at two ends, respectively, of array 16'. Thus, data lines 177 are interposed between the dummy column lines 177a and 177b. For displaying a typical picture content, a substantial number of transmission gates 126 simultaneously apply corresponding portions of the data ramp voltage 128 to the corresponding data lines 177 for developing in a given data line 177 a data ramp voltage VDATALINE.

A parasitic coupling capacitance CRC is associated with each intersection or crossover of each row select line 118 and each data line 177. A signal ROW-NOISE is produced on the respective select lines as a consequence of the parasitic capacitances coupling the chopped ramp signals applied to the data lines, to the row select lines.

The dummy column line 177a, having similar capacitances CRD but substantially larger than capacitances CRC, is used for developing a signal NOISE-SENSE representative of the signals ROW-NOISE developed in the row select lines 118. Signals ROW-NOISE are A/C coupled to line 177a via capacitances CRD. Capacitances CRD are inter-line capacitances between lines 118 and line 117a. An assumption is made that the signal ROW-NOISE in respective row select lines 118 that are de-selected has similar amplitude and waveform.

The signal NOISE-SENSE is coupled to an input terminal 201 of a noise cancellation amplifier 202. Amplifier 202 is a relatively high gain inverting amplifier which inverts the instantaneous level of signal NOISE-SENSE to produce a signal NOISE-CANCEL. Signal NOISE-CANCEL is an A/C signal that is coupled to the dummy column line 117b. Signal NOISE-CANCEL is capacitively coupled from line 117b via capacitances CRD to row select lines 118. Because signal NOISE-CANCEL is antiphase to signal NOISE-SENSE, signal NOISE-CANCEL tends to significantly reduce signals ROW-NOISE in each row select line 118.

It may be desirable to augment the parasitic capacitive coupling between row select lines 118 and dummy column lines 117a and 117b, shown schematically by capacitances CRD, to attain sufficient sensitivity and stability. Therefore, a width dimension W of each of lines 117a and 117b is made substantially greater than that of data line 117. For example, the total capacitance between lines 117a and row select lines 118 may be in the range of 2000 pf –3000 pf.

Figure 7:
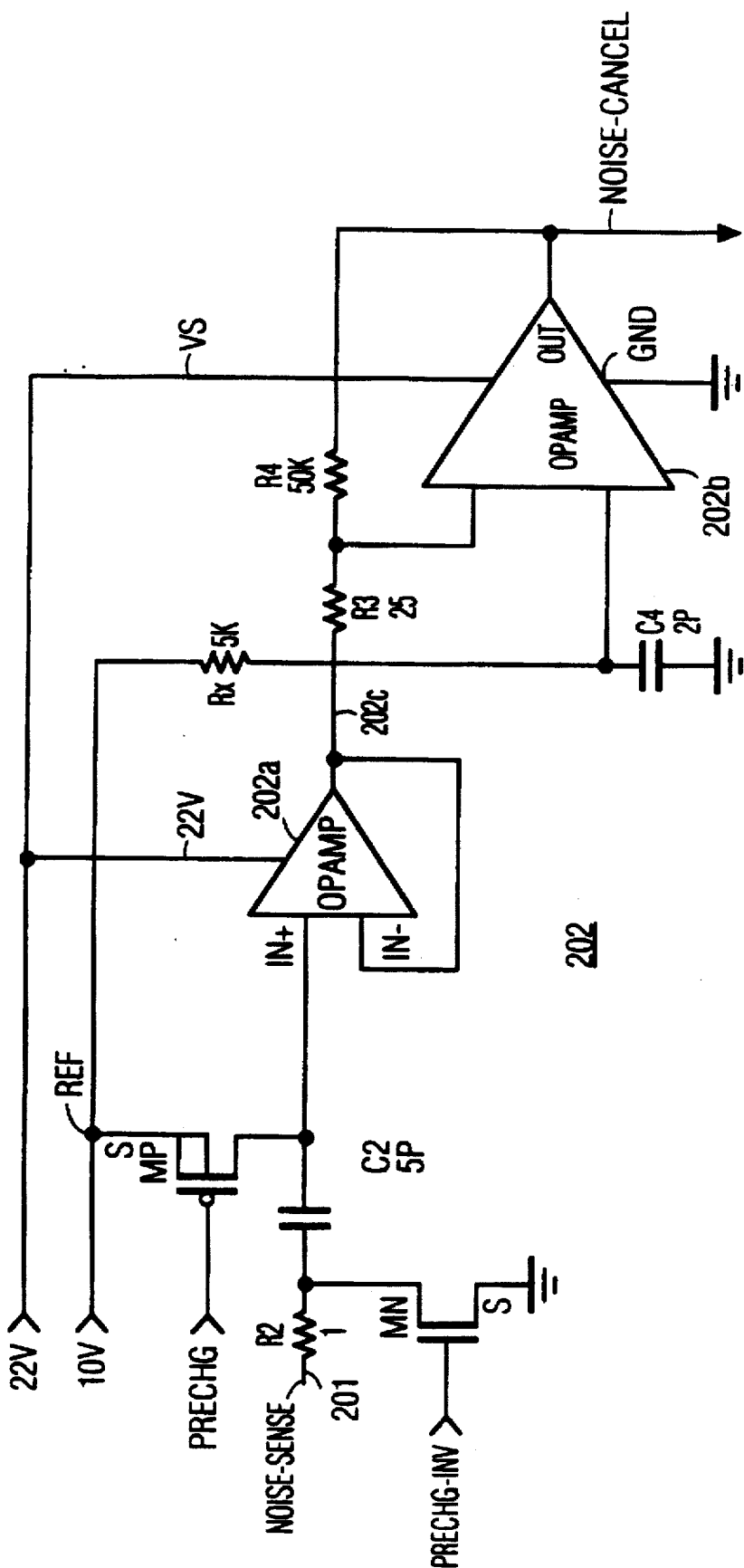
FIG. 7 illustrates in detail an amplifier of the circuit of FIG. 6.

FIG. 7 illustrates amplifier 202 of FIG. 6 in detail. Similar symbols and numerals in FIGS. 1, 2, 3a–3d and 4–7 indicate similar items or functions. Amplifier 202 of FIG. 7 includes a unity gain non-inverting amplifier 202a. Signal NOIS-ESENSE is coupled via a resistor R2 and a level shifting arrangement that includes a capacitor C2 to a non-inverting input terminal in+ of amplifier 202a. A P-type metal oxide semiconductor (MOS) transistor MP and an N-type MOS transistor MN develop a reference voltage REF of 10V across capacitor C2, when a pulse signal PRECHG and a complementary pulse signal PRECHAG-INV are developed at gates of transistors MP and MN, respectively. Thus, a voltage of, for example, 10V is summed with the instantaneous voltage of signal NOISE-SIGNAL at terminal in+. Transistors MP and MN are turned on and off for charging capacitor C2 in the vicinity of a time T1 of the waveform of ramp voltage VDATALINE of FIG. 6, prior to a ramping portion 66 of voltage VDATALINE.

Voltage REF of FIG. 7 is also coupled to a noninverting input terminal of a high gain inverting amplifier 202b via an R-C filter formed by a resistor Rx and a capacitor C4. An output signal OUT of amplifier 202a is coupled via a resistor R3 to an inverting input terminal of amplifier 202b. A feedback resistor R4 is coupled from an output terminal of amplifier 202b, where signal NOISE-CANCEL is developed, to the inverting input terminal of amplifier 202b. The A/C voltage gain of amplifier 202b with feedback is approximately equal to 2000.

As long as the voltage at terminal 201 is zero such as at time T1 when no signal disturbance occurs, the DC level shifting that is provided by the voltage across capacitor C2 produces an output signal 202c from amplifier 202a of 10V. As a result of the voltage of 10V developed at the non-inverting input terminal of amplifier 202b, the voltage at the output terminal of amplifier 202b where signal NOISE-CANCEL is developed is equal to 10V. Thus, a voltage range of signal NOISE-CANCEL of FIG. 7 has an upper range limit level in the vicinity of a supply voltage VS of +22V and a lower range limit level in the vicinity of 0V. Advantageously, signal NOISE-CANCEL is normally biased at approximately the mid-range between +22V and 0V thereby allowing the signal NOISE-CANCEL, voltage swing variations in opposite directions.

As explained before, signal NOISE-CANCEL substantially reduces the magnitude of signal NOISE-SENSE when the input voltage at terminal 201 of FIG. 6 varies. When the signal at terminal 201 varies such that signal NOISE-SENSE of a given amplitude is developed, signal NOISE-CANCEL of amplifier 202b tends to substantially reduce the amplitude of signal NOISE-SENSE. Because of the high gain of amplifier 202b the noise reduction is significant.

In carrying out an inventive feature, the capacitive coupling from line 17b to select lines 118 causes signal ROW-NOISE in each row select line 118 to advantageously be significantly reduced. The current i17 in transistor 17 of FIG. 2, is also advantageously reduced. Consequently, transistor 17 need not be driven by a large gate-to-source voltage. Therefore, transistor 17 is not significantly stressed. The result is that transistor 17 has a longer operational life than if it were stressed.

What is claimed is:

1. A video display apparatus for applying a video signal to pixels arranged in a plurality of rows and in a plurality of columns of an array of a display device, comprising:
 a plurality of row select line drivers for successively applying row select signals to a plurality of row select lines;
 a plurality of data line drivers for applying said video signal to a plurality of data lines associated with said plurality of columns; and
 an amplifier responsive to disturbance signals that are developed in corresponding lines of said array and coupled to an input of said amplifier via a first additional line for generating an amplified output signal, indicative of said disturbance signals, said output signal being coupled in a negative feedback manner via a second additional line of said arrays to said disturbance signal developing lines for substantially reducing said disturbance signals such that each of said additional lines is transverse to a given one of said disturbance signal developing lines.

2. An apparatus according to claim 1 wherein said disturbance signals are developed in a given row select line when said video signal is applied to said plurality of data lines and wherein said amplifier output signal is capacitively coupled to said plurality of row select lines via said second additional line.

3. An apparatus according to claim 1, wherein said second additional line is capacitively coupled to said plurality of row select lines for applying said amplifier output signal to said row select lines.

4. An apparatus according to claim 3 wherein said second additional line overlaps corresponding portions of said plurality of row select lines.

5. An apparatus according to claim 1 wherein said first additional line senses said disturbance signals, wherein said first additional line extends transversely to said row select lines and wherein said first additional line has a width dimension that is substantially larger than a width dimension of a given data line of said data lines in a manner to provide a larger capacitance between said first additional line and said row select lines.

6. An apparatus according to claim 1 wherein said second additional line is responsive to said amplifier output signal and is capacitively coupled to said plurality of row select lines for capacitively coupling said amplifier output signal to said plurality of row select lines.

7. An apparatus according to claim 6 wherein said second additional line extends transversely to said row select lines and has a width dimension that is substantially larger than a width dimension of a given data line of said plurality of data lines in a manner to increase a capacitance between said second additional line and said row select lines.

8. A display device having a plurality of data lines and a plurality of row select lines transverse to and crossing said plurality of data lines, wherein a parasitic capacitance is associated with respective crossovers and wherein signals applied to said data lines are undesirably coupled to said row select lines, comprising:
 a first conductor transverse to and crossing said plurality of row select lines, and wherein said signal coupled to said plurality of row select lines are at least partially capacitively coupled to said first conductor;
 a second conductor transverse to and crossing said plurality of row select lines and having coupling capacitances associated with respective crossovers of said plurality of row select lines; and an inverting amplifier having an input coupled to said first conductor and an output coupled to said second conductor.

9. A video display apparatus for applying a video signal to pixels defined by a first plurality of lines and a second plurality of lines that are disposed transversely with respect to said first plurality of lines to form a matrix, comprising:

a first plurality of drivers for applying a first plurality of signals to said first plurality of lines;

a second plurality of drivers for applying a second plurality of signals to said second plurality of lines such that said video signal is applied to said pixels in accordance with said first and second pluralities of signals, said second plurality of signals being undesirably coupled in said matrix to said first plurality of lines and develop disturbance signals in said first plurality of lines;

a first additional line disposed transversely to said first plurality of lines and coupled to said first plurality of lines for generating a first signal indicative of said disturbance signals;

a further line disposed transversely to said first plurality of lines and coupled to said first plurality of lines for applying said first signal to said first plurality of lines in a manner to reduce said disturbance signals.

10. An apparatus according to claim 9 further comprising, an amplifier responsive to said first signal for applying said first signal to said further line in a negative feedback manner to reduce said disturbance signals.

11. An apparatus according to claim 10 wherein said amplifier is an inverting amplifier.

12. An apparatus according to claim 10 wherein at least one of said further and additional lines is capacitively coupled to said first plurality of lines.

13. An apparatus according to claim 10 wherein said first plurality of lines are row select lines and said second plurality of lines are data lines of a liquid crystal display.

14. An apparatus according to claim 10 wherein each of said second plurality of drivers comprises a chopped ramp amplifier.

* * * * *